United States Patent
Bhagwan et al.

(10) Patent No.: US 10,833,684 B1
(45) Date of Patent: Nov. 10, 2020

(54) METHOD AND CIRCUITS FOR REDUCING NOISE IN PHASE-LOCKED LOOPS

(71) Applicant: Analog Bits Inc., Sunnyvale, CA (US)

(72) Inventors: Raghunand Bhagwan, Sunnyvale, CA (US); Alan C. Rogers, Palo Alto, CA (US)

(73) Assignee: Analog Bits Inc., Sunnyvale, CA (US)

( * ) Notice: Subject to any disclaimer, the term of this patent is extended or adjusted under 35 U.S.C. 154(b) by 0 days.

(21) Appl. No.: 16/743,702

(22) Filed: Jan. 15, 2020

(51) Int. Cl.
  *H03L 7/093* (2006.01)
  *H03L 7/089* (2006.01)
  *H03L 7/18* (2006.01)
  *H03L 7/099* (2006.01)

(52) U.S. Cl.
  CPC .......... *H03L 7/0891* (2013.01); *H03L 7/093* (2013.01); *H03L 7/099* (2013.01); *H03L 7/18* (2013.01)

(58) Field of Classification Search
  CPC ............................... H03L 7/089; H03L 7/093
  See application file for complete search history.

(56) References Cited

U.S. PATENT DOCUMENTS

| 7,659,782 | B2 | 2/2010 | Cong | |
| 2005/0062550 | A1 | 3/2005 | Melanson | |
| 2007/0030078 | A1* | 2/2007 | Wilson | H03L 7/093 331/16 |

OTHER PUBLICATIONS

Fischette et al., "A 45-nm SOI-CMOS Dual-PLL Processor Clock System for Multi-Protocol I/O," Powerpoint, PLL, 2009, p. 8.
Fischette, "First Time, Every Time—Practical Tips for PhaseLocked Loop Design," Powerpoint, PLL 2009, p. 69.

* cited by examiner

*Primary Examiner* — Patrick O Neill
(74) *Attorney, Agent, or Firm* — Fish & Richardson P.C.

(57) ABSTRACT

A phase locked loop (PLL) includes: a phase frequency detector configured to: generate one or more comparison signals indicating whether a reference input signal is leading a feedback signal or whether the feedback signal is leading the reference input signal; a charge pump coupled to the phase frequency detector and configured to convert the one or more comparison signals into a driving current; a loop filter coupled to the charge pump and configured to split the driving current to generate a first voltage signal and a second voltage signal; and a voltage controlled oscillator coupled to the loop filter and configured to: receive the first voltage signal and generate a first control current; receive the second voltage signal and generate a second control current; and combine the first and second control currents to jointly drive a charge controlled oscillator such that the output signal of a desired frequency is generated.

20 Claims, 5 Drawing Sheets

300

| | | M=0 | M=10 | M=100 |
|---|---|---|---|---|
| FIN | MHz | 156.25 | 156.25 | 156.25 |
| FOUT | MHz | 2500 | 2500 | 2500 |
| KCP | A | 50E-6 | 50E-6 | 50E-6 |
| KVCO | Hz/V | 10E+9 | 1E+9/9E+9 | 100E+6/9.9E+9 |
| RZ | Ω | 3E+3 | 30E+3 | 300E+3 |
| Cs | F | 1E-12 | 100E-15 | 10E-15 |
| Cp | F | 100E-12 | 100.9E-12 | 100.99E-12 |
| Closed Loop BW | Hz | 8.5E+6 | 8.5E+6 | 8.5E+6 |
| Closed Loop Peaking | dB | 0.48 | 0.48 | 0.48 |
| Jitter | VCO | ps | 1.01 | 1.01 | 1.01 |
| Jitter | RZ | ps | 1.03 | 0.33 | 0.10 |
| Jitter | Total RMS | ps | 2.09 | 1.14 | 1.04 |

FIG. 3A

METHOD AND CIRCUITS FOR REDUCING NOISE IN PHASE-LOCKED LOOPS

TECHNICAL FIELD

The disclosure generally relates to phase locked loop (PLL) devices and in particular to noise reduction in PLL devices.

BACKGROUND

Phase-locked loops (PLLs) are widely used in, for example, communications for coherent carrier tracking and threshold extension, bit synchronization, as well as symbol synchronization. A phase-locked loop (PLL) is an electronic circuit that controls an oscillator so that the PLL device maintains a constant phase relationship relative to an input reference signal. Generally, maintaining a constant phase relationship is otherwise referred to by stating that "the oscillator is in lock with" or "is locked to" the input reference signal.

SUMMARY

In one aspect, a phase lock loop (PLL) device is configured to receive a reference input signal and generate an output signal. The PLL device includes a phase frequency detector, a charge pump, a loop filter, and a voltage controlled oscillator. The phase frequency detector is configured to receive the reference input signal and a feedback signal, and to generate one or more comparison signals indicating whether the reference input signal is leading the feedback signal or whether the feedback signal is leading the reference input signal. The charge pump is coupled to the phase frequency detector and configured to receive the one or more comparison signals, and to convert the one or more comparison signals into a driving current. The loop filter is coupled to the charge pump and is configured to receive the driving current from the charge pump, and to split the driving current to generate a first voltage signal and a second voltage signal. The voltage controlled oscillator is coupled to the loop filter and is configured to receive the first voltage signal and generate a first control current, to receive the second voltage signal and generate a second control current, and to combine the first control current and the second control current to jointly drive a current controlled oscillator such that the output signal of a desired frequency is generated.

Implementations may include one or more of the following features. The loop filter may include a first capacitor configured to regulate the first voltage signal; a resistor connected in series to the first capacitor to form a first branch; and a second capacitor that forms a second branch arranged in parallel with the first branch such that the second voltage signal is regulated by the resistor and the second capacitor. The voltage controlled oscillator may be driven with less noise from the resistor than when the voltage controlled oscillator is controlled solely by the second voltage signal. The loop filter may be configured to generate the first and second voltage signals such that, in the voltage controlled oscillator, the first control current is approximately M−1 times in strength as the second control current, wherein M is larger than unity. M may be smaller than 100.

The voltage controlled oscillator may be characterized by a gain factor of KVCO, in units Hz/Volt. The voltage controlled oscillator may include: a first branch of voltage to current converter configured to receive the first voltage signal and generate the first control current; and a second branch of voltage to current converter configured to receive the second voltage signal and generate the second control current. The first branch of voltage to current converter may include a first group of one or more transistors and the second branch of voltage to current converters may include a second group of one or more transistors. The first branch of voltage to current converter driving the current controlled oscillator may contribute a first gain factor characterized as $(M-1)/M \times KVCO$. The second branch of voltage to current converter driving the current controlled oscillator may contribute a second gain factor characterized as $1/M \times KVCO$. The sum of the first and second gain factors may be KVCO.

The loop filter may be a low-pass filter. The resistor may be configured to modulate the driving current from the charge pump such that a phase of the output signal from the voltage controlled oscillator varies by a value that is proportional to a phase difference between the reference input signal and the output signal. The first capacitor may be configured to modulate the driving current from the charge pump such that the phase of the output signal from the voltage controlled oscillator varies by an integrative value of the phase difference between the reference input signal and the output signal. The second capacitor may be configured to filter ripples that arrive at the voltage controlled oscillator.

The PLL device may include a divider coupled to the voltage controlled oscillator and configured to: receive the output signal; and divide a frequency of the output signal by a division ratio to generate the feedback signal. The division ratio may be fractional.

In another aspect, some implementations provide a method for reducing phase noise in a PLL device. The method includes: receiving a reference input signal and a feedback signal; generating one or more comparison signals indicating whether the reference input signal is leading the feedback signal, or whether the feedback signal is leading the reference input signal; converting the one or more comparison signals into a driving current; splitting the driving current to generate a first voltage signal and a second voltage signal; and applying both the first and second voltage signals to jointly drive a voltage controlled oscillator to generate the phase-locked output signal with a phase noise reduced from when the voltage controlled oscillator is controlled by either the first voltage signal or the second voltage signal alone.

Implementations may include one or more of the following features.

The method may further include: dividing a frequency of the phase-locked output signal to generate the feedback signal. The method may include: regulating the first voltage signal by a first capacitor on a first branch and regulating the second voltage signal by a resistor on the first branch and a second capacitor on a second branch.

The method may further include: configuring the first branch to include: a proportional element that modulates the driving current such that a phase of the phase-locked output signal varies by a value that is proportional to a phase difference between the reference input signal and the feedback signal; and an integrative element that modulates the driving current such that the phase of the phase-locked output signal varies by an integrative value of the phase difference between the reference input signal and the feedback signal.

The method may further include: configuring the second branch to filter voltage ripples that arrive at the voltage controlled oscillator. The method may further include: controlling the voltage controlled oscillator with less noise from the resistor than when the voltage controlled oscillator is controlled solely by the second voltage signal.

The details of one or more embodiments are set forth in the accompanying drawings and the description below. Other aspects, features, and advantages will become apparent from the description, the drawings, and the claims.

DESCRIPTION OF DRAWINGS

FIG. 3A is a table showing various PLL metrics for different factors of M according to some implementations.

DETAILED DESCRIPTION

A phase locked loop (PLL) device generally incorporates a low pass filter (LPF) for feeding a voltage signal from a charge pump (CP) to drive a voltage controlled oscillator (VCO). This LPF typically includes a proportional element and an integral element. The proportional element modulates the CP output voltage such that phase of the VCO varies by a value proportional to the phase difference at the phase frequency detector (PFD) inputs and the integral element modulates the CP output voltage such that phase of the VCO varies by an integrated value of the phase difference of the PFD. While the PFD attempts to adjust this frequency difference, the correction mechanism of the PLL device can cause the phase at the output of PLL device to have phase noise or jitter. Metrics for benchmarking the performance of a PLL include frequency multiplication ratio (ratio of PLL output frequency to input reference frequency), the closed loop metrics like bandwidth, peaking, damping factor, etc. and the phase noise/jitter at PLL output.

Implementations described in the present disclosure can significantly reduce the noise of a loop filter resistor in a PLL, while maintaining other PLL metrics the same. In these implementations, the path between the CP output voltage to VCO output frequency is split into two. Instead of having a single voltage to current converter which converts voltage at the CP output voltage to current (e.g., denoted as I), some implementations split the voltage to current converter into two paths. Rather than using one node to achieve a VCO gain of KVCO, some implementations use two nodes: the first node allows a current output of about I×(M−1)/M producing a gain of KVCO×(M−1)/M, and the second node leads to a current output I/M and producing a gain of KVCO/M. The net effect of these modifications is to reduce phase noise (in units dBc/Hz) generated by the proportional element (which generally include the loop filter resistor) by a factor 10×log(M)), while keeping all other PLL performance metrics unchanged.

Figure 1:
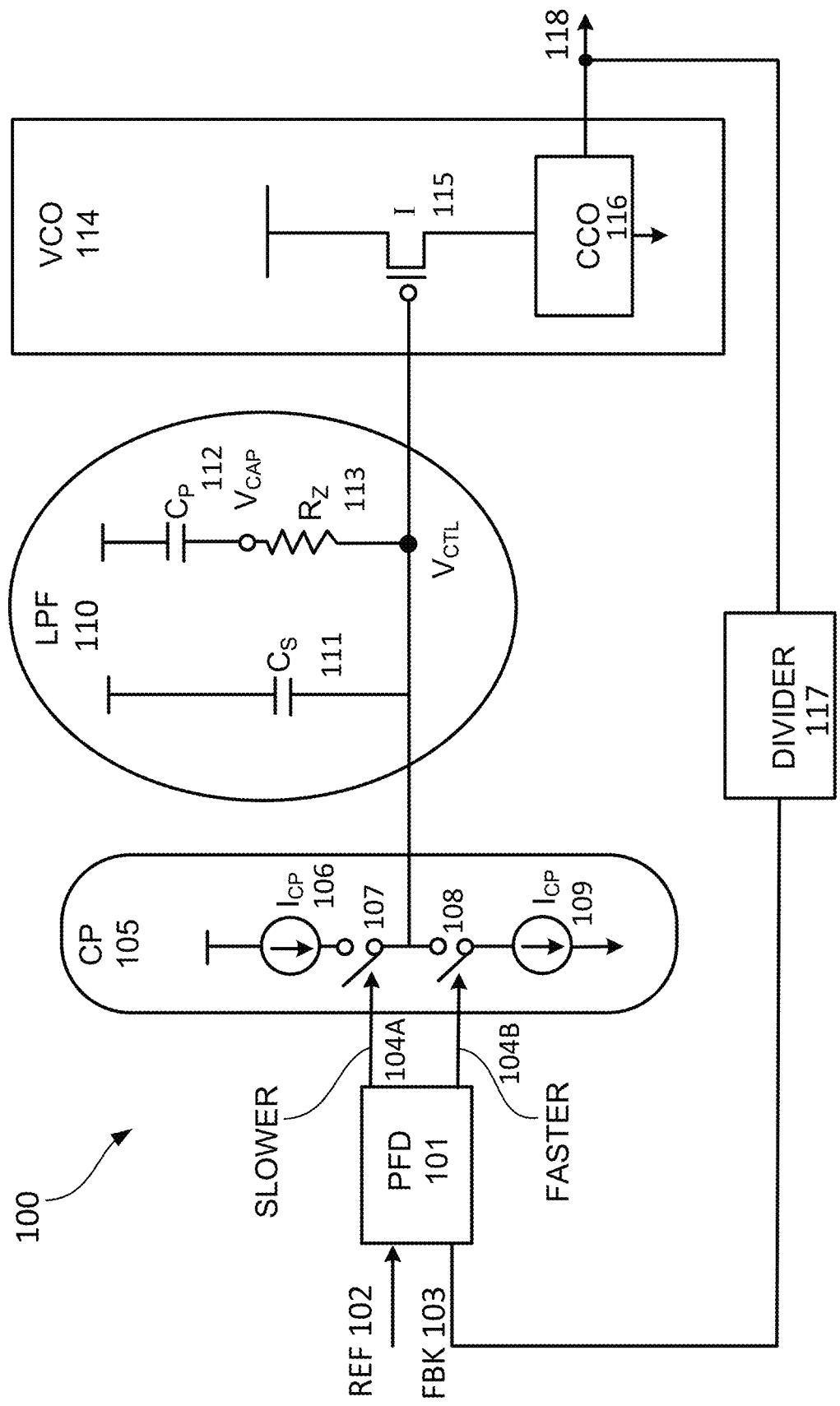
FIG. 1 shows an example of a prior art phase locked loop (PLL) device.

FIG. 1 shows an example of a phase locked loop (PLL) device 100. In this example, a phase and frequency detector (PFD) 101 is configured to receive a reference clock 102 and a feedback signal 103. The PFD 101 compares the reference clock 102 and the feedback signal 103 to generate proportional pulse width modulated signals at the outputs 104. If the feedback signal 103 lags the reference clock 102 in phase, a signal for FASTER is asserted for a time period proportional to the phase lag. Conversely, if the feedback signal 103 leads the reference clock 102 in phase, a signal for SLOWER is asserted for a time period proportional to the phase lag. In one example, the PFD 101 generates a first comparison signal 104A to indicate that feedback signal 103 is slower than the reference signal 102, and a second comparison signal 104B to indicate that the feedback signal 103 is faster than the reference signal 102.

The PFD 101 is coupled to a charge pump (CP) 105 to generate a voltage signal based on the comparison. In the example illustrated in FIG. 1, CP 105 converts the outputs of the PFD (including SLOWER signal 104A and FASTER signal 104B) into an analog quantity. In this example, if feedback signal leads the reference clock by 100 ps, SLOWER signal 104A will be asserted for a period 100 ps longer than the FASTER signal 104B, and the CP 105 will output a charge equal to $-I_{CP} \times 100$ ps, where $I_{CP}$ is the current output by CP 105 through switch 107. In this example, if feedback signal lags the reference clock by 100 ps, FASTER signal 104B will be asserted for a period 100 ps longer than the SLOWER signal 104A, and CP 105 will output a charge equal to $I_{CP} \times 100$ ps, where $I_{CP}$ is the current output by the CP, albeit flowing in the opposite direction, as shown through switch 108.

The output of the charge pump 105 gives rise to a voltage signal $V_{CTL}$ that is then provided to low pass filter (LPF) 110 which remove high frequency spurious signals by performing integration and low pass filtering. In more detail, the LPF 110 includes a first branch where capacitor $C_S$ 111 is present to filter the perturbations at $V_{CTL}$. Additional filtering elements can be added between $V_{CTL}$ and the input to the VCO, including passive or active low pass filters. The proportional element modulates voltage signal $V_{CTL}$ such that phase of the VCO varies by a value proportional to the phase difference at the inputs of PFD 101. The proportional element includes loop filter resister $R_Z$.

The integral element modulates the voltage signal $V_{CTL}$ such that phase of the VCO varies by an integrated value of the phase difference of the PFD 101. The integral element includes capacitors $C_P$ and $C_S$. For example, if a single instance of phase difference of +100 ps is encountered at the inputs of PFD 101, the negative feedback loop action of the PFD 101, CP 105 and LPF 110 could alter the phase of the VCO by a proportional amount of −10 ps (which is $\frac{1}{10}^{th}$ of the phase difference and is fixed from cycle to cycle) and by an integral amount of −1 ps (which is $\frac{1}{100}^{th}$ of the phase difference and cumulative from cycle to cycle), for every future cycle of the VCO. The integral amount of correction by definition is cumulative from cycle to cycle where the proportional amount of correction is fixed between cycles. The proportional element is determined by resistor $R_Z$ 113 and integral element determined by capacitor $C_P$ 112.

The output of the low-pass filter then drives a voltage controlled oscillator (VCO) 114, which converts the analog voltage at $V_{CTL}$ into a clock signal at the VCO output, with frequency proportional to the value of $V_{CTL}$. In this example, the VCO 114 includes a voltage to the current converter (V2I) 115 which accepts $V_{CTL}$ as inputs and produces an output current proportional to value of $V_{CTL}$, which drives a current controlled oscillator (CCO) 116. The frequency of the current controlled oscillator (CCO) 116 is proportional to the driving current, i.e. the current out of the V2I 115. The VCO 114 generates an output signal at a particular frequency, which in some instances, can be proportional to the voltage signal from the low-pass filter (LPF) 110. The output signal 118 from the VCO 114 may be known as the VCO clock signal. In this illustration, the VCO clock signal is frequency divided by a frequency divider 117 to generate a frequency-divided VCO clock signal to generate a feedback signal 103. In some cases, multiple dividers may be used in cascade. In this cascade, each frequency division is characterized by a division ratio. Each division ratio can be distinct.

Several metrics impact the performance of PLL devices. These metrics include frequency multiplication ratio (for example, the ratio of PLL output frequency to input reference frequency), the phase noise/jitter at PLL output, and the loop dynamics of the PLL (such as closed loop bandwidth, peaking of the closed loop transfer function, the damping factor, and the phase margin). The metrics additionally include power consumption by the PLL and area occupied by the PLL.

A variety of applications can enjoy advantages when the phase noise/jitter at the PLL output is reduced. A significant contributor to phase noise/jitter at PLL output is the loop stabilizing resistor $R_Z$ in the loop filter. One straight forward approach to reduce the contribution of jitter from $R_Z$ would be to reduce its value. But to maintain comparable loop dynamics while reducing $R_Z$ would entail a concomitant increase of $I_{CP}$, the capacitances of $C_P$ and $C_S$. Increasing $C_P$ and $C_S$ would increase the area occupied by the PLL, which can become undesirable. Increasing $I_{CP}$ would increase the power consumed by the PLL, which is likewise undesirable. Another straight forward way to reduce the contribution of jitter from $R_Z$ would be to reduce the gain factor of the VCO. The gain of the VCO, known as KVCO, is defined as:

$$\frac{\text{change in VCO output frequency}}{\text{change in control voltage } V_{CTL}} \quad (1)$$

This gain is expressed in units of Hz/V or GHz/V. This parameter KVCO appears in both the proportional and integral feed forward path of the PLL behavioral equations. Generally, KVCO is determined by two factors, the frequency of the VCO and the voltage of VCO operation. Reducing KVCO is not trivial. This approach would entail significant circuit additions which will affect the power consumed by the PLL and/or area occupied by the PLL. These additions can lead to alternate structures of the VCO, such as an LC VCO (as opposed to a ring oscillator VCO) which would again consume more power and/or area.

Figure 2:
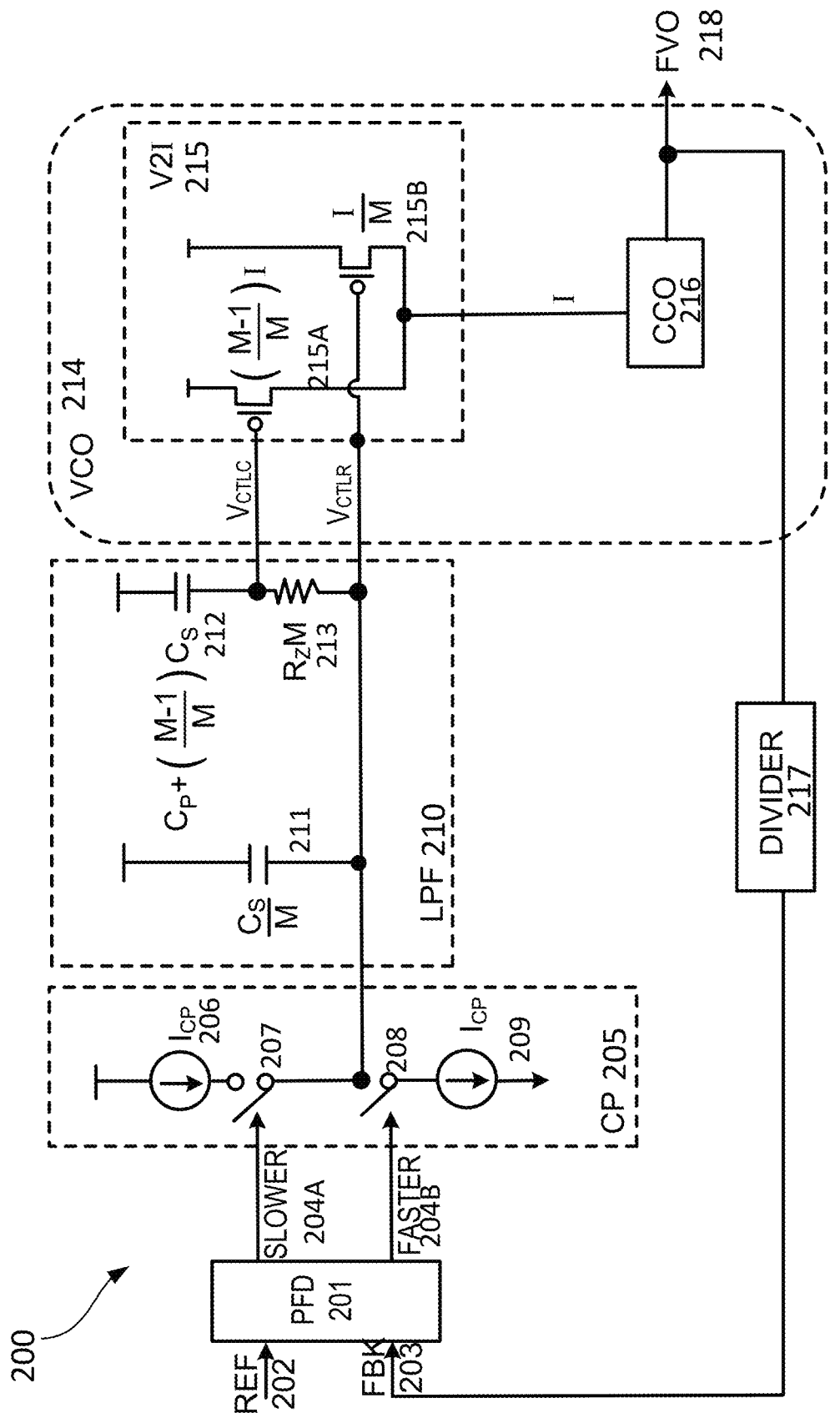
FIG. 2 shows an example of a phase locked loop (PLL) device according to some implementations.

A technique to reduce the phase noise contribution of the loop resistor, without affecting or with limited effect on any other PLL design parameter/metric is illustrated in FIG. 2, which shows an example of a phase locked loop (PLL) device 200 according to some implementations of the present disclosure.

In this example, a phase and frequency detector (PFD) 201 is configured to receive a reference clock signal 202 and a feedback signal 203. The PFD 201 performs comparison of the reference clock signal 202 and the feedback signal 203 to generate a proportional pulse width modulated signals at the outputs of PFD 201. Like the example in FIG. 1, if the feedback signal 203 lags the reference clock 202 in phase, the FASTER signal is asserted for a time period proportional to the phase lag, and if the feedback signal 203 leads the reference clock 202 in phase, the SLOWER signal is asserted for a time period proportional to the phase lag. In one example, the PFD 201 generates a first comparison signal 204A to indicate that feedback signal 203 is slower than the reference signal 202, and a second comparison signal 204B to indicate that the feedback signal 203 is faster than the reference signal 202.

The PFD 201 is coupled to a charge pump (CP) 205 to generate a voltage signal based on the comparison. In the example illustrated in FIG. 2, CP 205 converts the outputs of the PFD (including SLOWER signal 204A and FASTER signal 204B) into an analog quantity. As illustrated, if feedback signal leads the reference clock, SLOWER signal 204A will be asserted longer than the FASTER signal 204B, and the CP 205 will generate a charge through a switch 207. In this example, if feedback signal lags the reference clock, FASTER signal 204B will be asserted longer than the SLOWER signal 204A, and the CP 205 will output a charge through a switch 208.

The voltage signal is then provided to low pass filter 210, which removes high frequency spurious signals by performing integration and low pass filtering. The output of the low-pass filter then drives a voltage controlled oscillator (VCO) 214. The VCO generates an output signal at a frequency, which in some instances, can be proportional to the voltage signal from the low-pass filter 210. The output signal 218 from VCO 214 may be known as the VCO clock signal. In this illustration, the VCO clock signal is frequency divided by a divider 217 to generate a frequency-divided VCO clock signal that provides the feedback signal 203. Additional frequency dividers may be included for further frequency division for generating the feedback signal 203.

In this example, the path between $V_{CTL}$ and the VCO frequency output is split into two routes. Instead of having a single voltage to current converter (V2I) which converts a voltage at node $V_{CTL}$ to a current (denoted as I), the voltage to current conversion is split into two routes. Instead of having one node $V_{CTL}$ through which the gain of the VCO is KVCO, the node is split in two: one node $V_{CTLC}$ has a current output I×(M−1)/M producing a gain KVCO×(M−1)/M and another node $V_{CTLR}$ which will have a current output I/M producing a gain KVCO/M. The summation of the two paths equals the original gain of KVCO. Here, M could by any factor greater than unity (1). If M equals to ten (10), then path through $V_{CTLC}$ will have gain 0.9KVCO and path through VCLR will have gain 0.1KVCO. Methods other than using a V2I to split gain of VCO could be used with same results.

In the LPF filter 210, if the following transformations are used, i.e.

$$Rz' = Rz \times M \quad (2)$$

$$Cp' = Cp + Cs\left(\frac{M-1}{M}\right) \quad (3)$$

$$Cs' = \frac{Cs}{M} \quad (4)$$

The proportional path gain also termed phase gain or PG and the integral path gain also termed frequency gain or FG are as follows $$PG \propto ICP \times Rz' \times KVCO/M \quad (5)$$

$$FG \propto ICP \times KVCO \times (Cp' + Cs') \quad (6)$$

These reduce to the following equations if the transformations Rz', Cp' and Cs' are used $$PG \propto ICP \times RZ \times KVCO \quad (7)$$

$$FG \propto ICP \propto KVCO \times (Cp+Cs) \qquad (8)$$

As such, the PG and FG of the modified filter remains unaltered keeping all PLL performance metrics unchanged.

In the example illustrated in FIG. 2, after connecting $V_{CTLC}$ to the gate of transistor 215A, and connecting $V_{CTLR}$ to the gate of transistor 215B, the combined current that drives the CCO 216 remains about the same as before the split. The net effect of these modifications is to reduce phase noise (in units dBc/Hz) generated by $R_Z$ by a factor 10×log (M), keeping all other PLL performance metrics unchanged. Here, the factor M can be chosen to achieve the desired reduction in $R_Z$ noise. Some implementations may allocate 10 or 100 for M, yielding reduction of $R_Z$ contributed noise of about −10 dB to about −20 dB. Further increasing M to beyond 100 could introduce other complications and may not be as advantageous. Reduction of noise contributed by $R_Z$ by a factor of 10 to 20 dB without altering other PLL performance metrics may still represent substantial business value as a technical comprise.

Figure 3B:
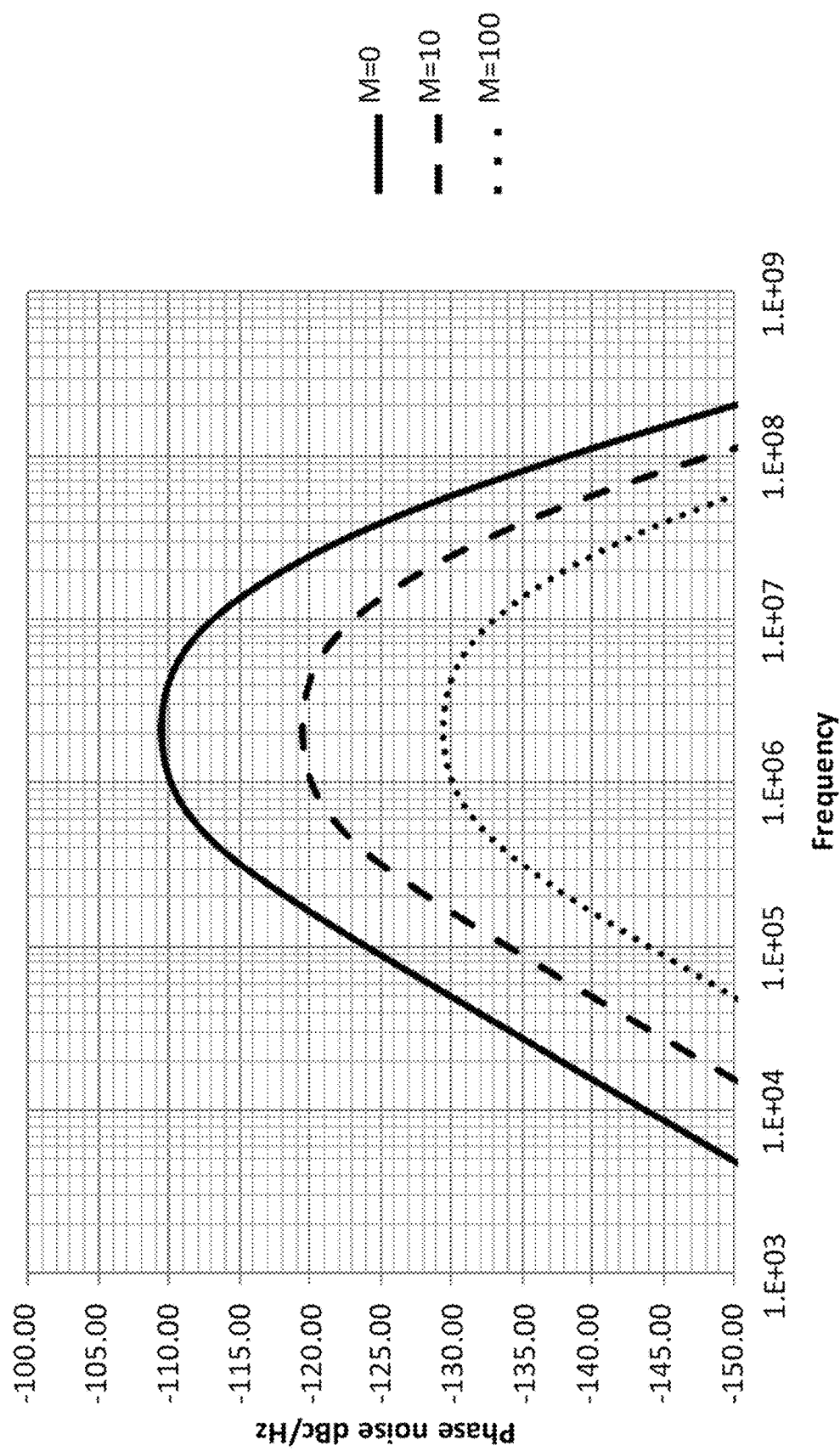
FIG. 3B is a frequency spectrum plot of phase noise for different factors of M according to some implementations.

FIGS. 3A and 3B illustrate comparative benefits of this innovation for a PLL example. FIG. 3A shows the tabulation of various PLL metrics such as FIN (frequency of input), FOUT (frequency of output), KCP (charge pump gain), KVCO (VCO gain), values of CS, CP, RZ, the bandwidth and peaking of the PLL closed loop transfer function, and the jitter contributions of VCO, RZ and the total jitter—for different values of M. It is to be noted that M=0 corresponds to no bifurcation of the path between VCTL and VCO frequency into two routes, which is effectively the prior art. Illustrative examples are provided for values M=10 and M=20. As M increases, the jitter contributed by RZ to output reduces by a $\sqrt{M}$ factor while performance metrics of the PLL like closed loop BW and closed loop peaking remain substantially unaltered.

Figure 4:
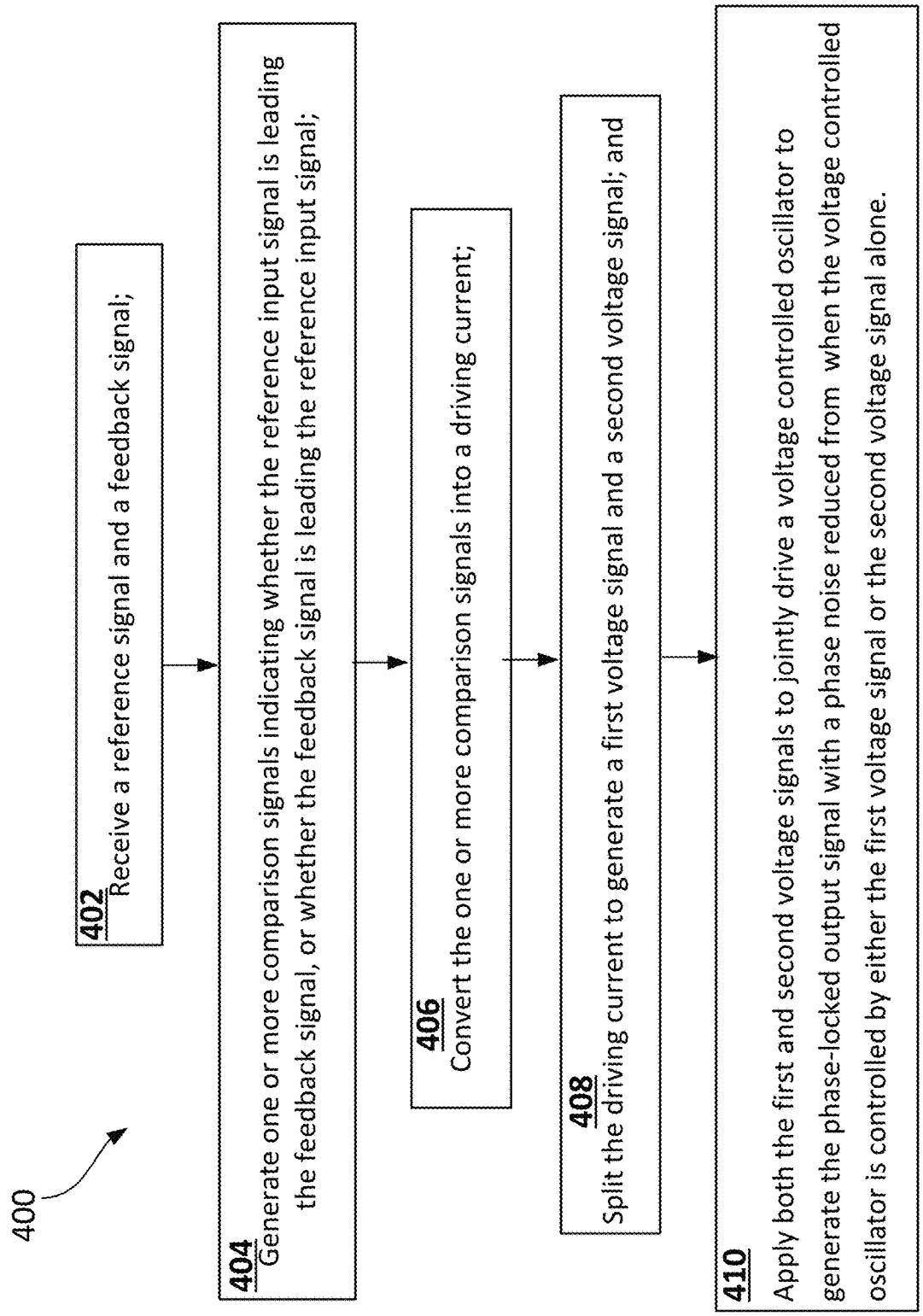
FIG. 4 is an example of a flow chart for reducing noise in phase locked loop (PLL) devices according to some implementations Like reference symbols in the various drawings indicate like elements.

FIG. 3B shows the frequency spectrum plot of phase noise contribution of RZ for different values of M. Note that phase noise improves in a 10×log(1/M) fashion, reducing by 10 dB for M=10 and by 20 dB for M=100. This reduction in phase noise causes reduced jitter contribution of RZ at the output as tabulated in FIG. 3A FIG. 4 shows an example of a flow chart 300 for reducing noise in phase locked loop (PLL) devices according to some implementations of the present disclosure. The method is applicable to a variety of passive analog filter based PLL devices, as well as integer, fractional, sigma delta PLL devices. In some implementations, a PLL device receives a reference input signal and a feedback signal (302). The PLL device then generates one or more comparison signals indicating whether the reference input signal is leading the feedback signal, or whether the feedback signal is leading the reference input signal (304). This comparison may be performed by a phase and frequency detector. Thereafter, the PLL device converts the one or more comparison signals into a driving current (306). The conversion may be performed by a charge pump. Notably, the PLL device then split the driving current to generate a first voltage signal and a second voltage signal (308). The split may be performed in a loop filter. The PLL device may regulate the first voltage signal by a first capacitor on a first branch in the loop filter and regulate the second voltage signal by a resistor on the first branch and a second capacitor on a second branch of the loop filter. The first branch of the loop filter may be configured to include a proportional element that modulates the driving current such that a phase of the phase-locked output signal varies by a value that is proportional to a phase difference between the reference input signal and the feedback signal; and an integrative element that modulates the driving current such that the phase of the phase-locked output signal varies by an integrative value of the phase difference between the reference input signal and the feedback signal. The second branch of the loop filter may be configured to filter voltage ripples that arrive at the voltage controlled oscillator.

The PLL device then applies both the first and second voltage signals to jointly drive a voltage controlled oscillator to generate the phase-locked output signal with a phase noise reduced from when the voltage controlled oscillator is controlled by either the first voltage signal or the second voltage signal alone (310). In this manner, the PLL device may be configured to control the voltage controlled oscillator with less noise from the resistor than when the voltage controlled oscillator is controlled solely by the second voltage signal. The PLL device may further divide a frequency of the phase-locked output signal to generate the feedback signal.

What has been described is a PLL method and apparatus which can be employed on or in conjunction with Σ-Δ modulation for, for example, deserializing incoming bit stream on a USB device. Although the example of PLL circuit is advantageously employed as an on-chip component of any chip requiring a PLL, the advantages of the application are best exploited within microprocessor chips having very high operational frequencies. Indeed, a number of implementations have been described. Nevertheless, it will be understood that various modifications can be made without departing from the spirit and scope of the subject innovation. In addition, the logic flows depicted in the figures do not require the particular order shown, or sequential order, to achieve desirable results. In addition, other steps may be provided, or steps may be eliminated, from the described flows, and other components may be added to, or removed from, the described systems. Accordingly, other implementations are within the scope of the following claims.

What is claimed is:

1. A phase lock loop (PLL) device configured to receive a reference input signal; and generate an output signal, the PLL device comprising:
   a phase frequency detector configured to:
      receive the reference input signal and a feedback signal; and
      generate one or more comparison signals indicating whether the reference input signal is leading the feedback signal or whether the feedback signal is leading the reference input signal;
   a charge pump coupled to the phase frequency detector and configured to:
      receive the one or more comparison signals; and
      convert the one or more comparison signals into a driving current;
   a loop filter coupled to the charge pump and configured to:
      receive the driving current from the charge pump; and
      split the driving current to generate a first voltage signal and a second voltage signal; and
   a voltage controlled oscillator coupled to the loop filter and configured to:
      receive the first voltage signal and generate a first control current;
      receive the second voltage signal and generate a second control current; and combine the first control current and the second control current to jointly drive a charge controlled oscillator such that the output signal of a desired frequency is generated.

2. The PLL device of claim 1, wherein the loop filter comprises:
   a first capacitor configured to regulate the first voltage signal;
   a resistor connected in series to the first capacitor to form a first branch; and
   a second capacitor that forms a second branch arranged in parallel with the first branch such that the second voltage signal is regulated by the resistor and the second capacitor.

3. The PLL device of claim 2, wherein the charge controlled oscillator is driven with less noise from the resistor than when the charge controlled oscillator is controlled solely by the second voltage signal.

4. The PLL device of claim 2, wherein the loop filter is configured to generate the first and second voltage signals such that, in the voltage controlled oscillator, the first control current is approximately M−1 times in strength as the second control current, wherein M is larger than unity.

5. The PLL device of claim 4, wherein M is smaller than 100.

6. The PLL device of claim 4, wherein the voltage controlled oscillator is characterized by a gain factor of KVCO, in units Hz/Volt.

7. The PLL device of claim 6, wherein the voltage controlled oscillator comprises:
   a first branch of voltage to current converter configured to receive the first voltage signal and generate the first control current; and
   a second branch of voltage to current converter configured to receive the second voltage signal and generate the second control current.

8. The PLL device of claim 7, wherein the first branch of voltage to current converter comprises a first group of one or more transistors and the second branch of voltage to current converters comprises a second group of one or more transistors.

9. The PLL device of claim 7, wherein the first branch of voltage to current converter driving the charge controlled oscillator contributes a first gain factor characterized as (M−1)/M×KVCO, wherein the second branch of voltage to current converter driving the charge controlled oscillator contributes a second gain factor characterized as 1/M× KVCO, and wherein a sum of the first and second gain factors equals KVCO.

10. The PLL device of claim 2, wherein the loop filter is a low-pass filter.

11. The PLL device of claim 2, wherein the resistor is configured to modulate the driving current from the charge pump such that a phase of the output signal from the voltage controlled oscillator varies by a value that is proportional to a phase difference between the reference input signal and the output signal; and
   wherein the first capacitor is configured to modulate the driving current from the charge pump such that the phase of the output signal from the voltage controlled oscillator varies by an integrative value of the phase difference between the reference input signal and the output signal.

12. The PLL device of claim 2, wherein the second capacitor is configured to filter ripples that arrive at the voltage controlled oscillator.

13. The PLL device of claim 1, further comprising:
   a divider coupled to the voltage controlled oscillator and configured to:
   receive the output signal; and
   divide a frequency of the output signal by a division ratio to generate the feedback signal.

14. The PLL device of claim 13, wherein the division ratio is fractional.

15. A method to generate a phase-locked output signal, the method comprising:
   receiving a reference input signal and a feedback signal;
   generating one or more comparison signals indicating whether the reference input signal is leading the feedback signal, or whether the feedback signal is leading the reference input signal;
   converting the one or more comparison signals into a driving current;
   splitting the driving current to generate a first voltage signal and a second voltage signal; and
   applying both the first and second voltage signals to jointly drive a voltage controlled oscillator to generate the phase-locked output signal with a phase noise reduced from when the voltage controlled oscillator is controlled by either the first voltage signal or the second voltage signal alone.

16. The method of claim 15, further comprising:
   dividing a frequency of the phase-locked output signal to generate the feedback signal.

17. The method claim 15, further comprising:
   regulating the first voltage signal by a first capacitor on a first branch and
   regulating the second voltage signal by a resistor on the first branch and a second capacitor on a second branch.

18. The method of claim 17, further comprising:
   configuring the first branch to include:
   a proportional element that modulates the driving current such that a phase of the phase-locked output signal varies by a value that is proportional to a phase difference between the reference input signal and the feedback signal; and
   an integrative element that modulates the driving current such that the phase of the phase-locked output signal varies by an integrative value of the phase difference between the reference input signal and the feedback signal.

19. The method of claim 17, further comprising:
   configuring the second branch to filter voltage ripples that arrive at the voltage controlled oscillator.

20. The method of claim 17, further comprising:
   controlling the voltage controlled oscillator with less influence from the resistor than when the voltage controlled oscillator is controlled solely by the second voltage signal.

* * * * *